US006940357B2

(12) United States Patent
Ota et al.

(10) Patent No.: US 6,940,357 B2
(45) Date of Patent: Sep. 6, 2005

(54) BIPOLAR TRANSISTOR, FOR VOLTAGE CONTROLLED OSCILLATOR USING A CAPACITANCE ADJUSTMENT LINE

(75) Inventors: Yorito Ota, Kobe (JP); Kazuhiro Arai, Imaichi (JP); Yasuyuki Toyoda, Mukoh (JP); Shinichi Sonetaka, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 40 days.

(21) Appl. No.: 10/613,182

(22) Filed: Jul. 3, 2003

(65) Prior Publication Data

US 2004/0036544 A1 Feb. 26, 2004

(30) Foreign Application Priority Data

Aug. 22, 2002 (JP) ........................................ 2002-242499

(51) Int. Cl.[7] .............................................. H01L 27/15
(52) U.S. Cl. ............................... 331/108 C; 331/36 C; 257/516
(58) Field of Search ........................... 331/108 C, 36 C; 257/516, 577, 572, 573, 584, 587

(56) References Cited

U.S. PATENT DOCUMENTS

| 5,055,838 A | * | 10/1991 | Wise et al. | ............ 340/870.37 |
|---|---|---|---|---|
| 5,600,157 A | * | 2/1997 | Abiko et al. | ................... 257/84 |
| 6,407,432 B1 | * | 6/2002 | Nemoto et al. | ............. 257/354 |
| 6,417,557 B1 | * | 7/2002 | Haruki | ....................... 257/532 |
| 2004/0041201 A1 | * | 3/2004 | Sugiyama et al. | .......... 257/316 |

FOREIGN PATENT DOCUMENTS

JP        2003-174033        6/2003

OTHER PUBLICATIONS

Toyoda, et al., "Hight–Breakdown–Voltage SiGe HBT Device for VCOs", 2001 New Technology of Matsushita Electric Industrial Co., Ltd., May 2002, pp. 121–124.

* cited by examiner

*Primary Examiner*—Joseph Chang
(74) *Attorney, Agent, or Firm*—Hamre, Schumann Mueller & Larson P.C.

(57) ABSTRACT

There is provided a bipolar transistor that enables a desirably enhanced high-frequency performance to be obtained when used as an oscillation amplifier of an oscillation circuit, and that is miniaturized and reduced in cost. A capacitance adjustment line (11) connected to a base pad (7) forms a parasitic capacitor with respect to an $N^+$ collector substrate by interposing an insulating film (3) and an N collector substrate therebetween, thereby increasing collector-base capacitance $C_{cb}$. This capacitor is incorporated into a bipolar transistor, which functions as an oscillation amplifier and has a small transistor operation region (2), at least as a part of a balance capacitor constituting the oscillation circuit in the course of production of a semiconductor.

6 Claims, 8 Drawing Sheets

BIPOLAR TRANSISTOR, FOR VOLTAGE CONTROLLED OSCILLATOR USING A CAPACITANCE ADJUSTMENT LINE

BACKGROUND OF THE INVENTION

1. Field of the Invention

The present invention relates to a bipolar transistor, and in particular, to a bipolar transistor used for a voltage controlled oscillator (VCO), an oscillation circuit using the bipolar transistor, and a voltage controlled oscillator using the oscillation circuit.

2. Description of the Related Art

Due to the rapid spread of mobile telephones during the past 10 years, high-frequency device techniques and high-frequency circuit techniques have advanced remarkably. As a result, high-frequency devices such as a mobile telephone terminal are being enhanced in performance, miniaturized, and reduced in cost year after year.

A voltage controlled oscillator (VCO) is an example of a key circuit in the above-mentioned communication apparatuses. The VCO generally is composed of a resonance circuit, an oscillation circuit, and a buffer circuit, and provides a stable high-frequency carrier signal required for communication, even at varying temperatures and the like. FIG. 11 shows the configuration thereof.

In FIG. 11, the VCO is composed of a resonance circuit 111 including a variable capacitor whose capacitance value is varied depending upon an applied voltage $V_p$, an inductor, and the like; an oscillation circuit 112 for oscillating a signal with a frequency in accordance with the resonance frequency of the resonance circuit 111; and a buffer circuit 113 for amplifying the obtained oscillation signal to output a high-frequency signal $RF_{out}$. FIG. 11 illustrates one possible example of a VCO. Various circuits including transistors in different types have been proposed. Generally, the circuit shown in FIG. 11 is a representative example.

Herein, balance capacitors $C_{ce}$ and $C_{cb}$ connected to a bipolar transistor T1 are required in the oscillation circuit 112. The balance capacitors $C_{ce}$ and $C_{cb}$ are used for minute adjustment of an oscillation frequency, adjustment of an output, and adjustment of a fluctuation of a supply voltage and C/N characteristics (carrier-to-noise ratio) to be an important factor of the oscillation circuit.

The above-mentioned circuits are modularized or implemented in an IC chip for miniaturization of mobile telephones. A discrete (single) bipolar transistor mounted in a small package lowers the cost as well as miniaturize the circuit. A conventional bipolar transistor will be described with reference to FIGS. 9 and 10.

FIG. 9 is a plan view of a conventional bipolar transistor seen from the upper surface of a chip. FIG. 10 is a cross-sectional view taken along a line c–c' in FIG. 9. In FIGS. 9 and 10, reference numeral 1 denotes an $N^+/N$ type collector substrate as a semiconductor substrate; 2 denotes a transistor operation region in which a bipolar transistor is formed; 3 denotes an insulating film formed on the surfaces of the collector substrate 1 and the transistor operation region 2; 4 and 6 respectively denote an emitter lead line and a base lead line formed on the insulating film 3 therethrough from the transistor operation region 2; 5 and 7 respectively denote an emitter pad and a base pad connected to the emitter lead line 4 and the base lead line 6 and subjected to wire bonding during assembly; and 8 denotes a collector electrode formed on the reverse surface of the collector substrate 1.

Furthermore, in the transistor operation region 2, a P-type diffusion base 21, a $P^+$ base contact 22, and an $N^+$ emitter 23 are formed. Such a chip configuration will be referred to as a substrate collector configuration.

However, conventionally, in order to constitute the oscillation circuit 112 as shown in FIG. 11, the balance capacitors $C_{ce}$ and $C_{cb}$ that are discrete devices are externally attached to the discrete bipolar transistor T1. Because of the external capacitors, the Q-value (ratio between an inductance or capacitance component and a resistance component) of the oscillation circuit 112 is decreased, which results in a decrease in C/N of the oscillation circuit 112.

SUMMARY OF THE INVENTION

Therefore, with the foregoing in mind, it is an object of the present invention to provide a bipolar transistor in which at least a part of a balance capacitor constituting an oscillation circuit is incorporated in the course of production of a semiconductor, an oscillation circuit in which desirably enhanced high-frequency performance is obtained by using the bipolar transistor, and a voltage controlled oscillator that has high performance and is miniaturized and reduced in cost by using the oscillation circuit.

In order to achieve the above-mentioned object, a bipolar transistor of the present invention includes: a semiconductor substrate; a transistor operation region formed on the semiconductor substrate; an insulating film formed so as to cover a surface of the semiconductor substrate; a lead line led to a surface of the insulating film therethrough from the transistor operation region; a pad for wire bonding connected to the lead line; and a capacitance adjustment line connected to the pad.

In the bipolar transistor of the present invention, the semiconductor substrate is an $N^+/N$ type collector substrate, a collector electrode is formed on a reverse surface of the collector substrate, and the pad is formed on a surface of the collector substrate as an emitter pad and a base pad.

In this case, by adjusting an area of the capacitance adjustment line connected to at least one of the base pad and the emitter pad, at least one capacitance value of a corresponding collector-base capacitor and collector-emitter capacitor is adjusted.

Furthermore, by adjusting lengths of lines opposed to each other of the capacitance adjustment line connected to the emitter pad and the capacitance adjustment line connected to the base pad, a capacitance value of an emitter-base capacitor is adjusted.

In this case, it is preferable that the capacitance adjustment line connected to the emitter pad and the capacitance adjustment line connected to the base pad are disposed in a comb shape.

Furthermore, in the bipolar transistor of the present invention, the semiconductor substrate is an $N^+/N$ type emitter substrate, an emitter electrode is formed on a reverse surface of the emitter substrate, and the pad is formed on a surface of the emitter substrate as a collector pad and a base pad.

In this case, the capacitance adjustment line connected to the collector pad and the capacitance adjustment line connected to the base pad, which is opposed to the capacitance adjustment line connected to the collector pad, interpose the insulating film therebetween to form a collector-base capacitor as a Metal-Insulator-Metal (MIM) type capacitor, and by adjusting an opposed area of the capacitance adjustment lines, a capacitance value of the collector-base capacitor is adjusted.

In order to achieve the above-mentioned object, a first oscillation circuit of the present invention uses the bipolar transistor of the present invention as an oscillation amplifier, wherein at least a part of a capacitor contributing to an oscillation operation is composed of a parasitic capacitor formed between the capacitance adjustment line and the collector electrode opposed thereto.

In order to achieve the above-mentioned object, a second oscillation circuit of the present invention uses the bipolar transistor of the present invention as an oscillation amplifier, wherein at least a part of a capacitor contributing to an oscillation operation is composed of a parasitic capacitor formed between the capacitance adjustment line connected to the emitter pad and the capacitance adjustment line connected to the base pad.

In order to achieve the above-mentioned object, a third oscillation circuit of the present invention using the bipolar transistor of the present invention as an oscillation amplifier, wherein at least a part of a capacitor contributing to an oscillation operation is composed of the MIM type capacitor.

In order to achieve the above-mentioned object, a voltage controlled oscillator of the present invention includes: a resonance circuit for varying a value of a resonance frequency in accordance with an input voltage; any of first to third oscillation circuits for oscillating a signal with a frequency in accordance with the resonance frequency; and a buffer circuit for amplifying and outputting the oscillation signal from the oscillation circuit.

According to the above-mentioned configuration, the collector-base capacitor and the collector-emitter capacitor formed between the capacitance adjustment line and the $N^+$ collector substrate, and the emitter-base capacitor formed between the capacitance adjustment line connected to the emitter pad and the capacitance adjustment line connected to the base pad are increased, and these capacitors can be incorporated into a bipolar transistor having a small transistor operation region, at least as a part of the balance capacitor constituting the oscillation circuit in the course of production of a semiconductor.

Furthermore, the above-mentioned value of the capacitance between terminals can be adjusted easily by using the capacitance adjustment line, and desirably enhanced high-frequency performance can be obtained in an oscillation circuit.

Furthermore, by using the above-mentioned oscillation circuit, a voltage controlled oscillator can be realized, which has high performance and is miniaturized and reduced in cost.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative embodiments with reference to the drawings. The bipolar transistors described in the following embodiments are applicable to the oscillation circuit and the VCO shown in FIG. 11 described in the conventional example.

Embodiment 1

Figure 1:
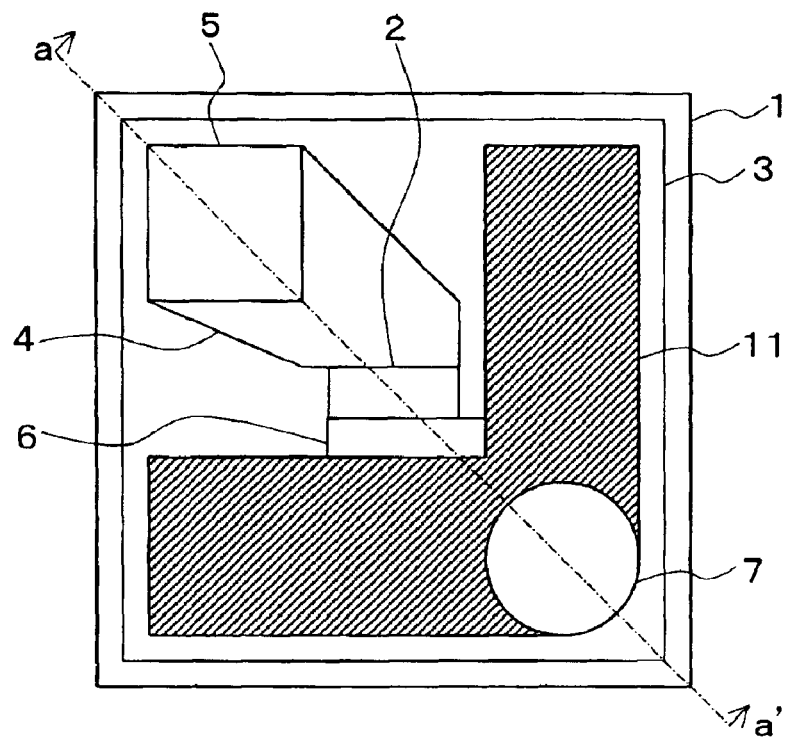
FIG. 1 is a plan view showing an exemplary configuration of a bipolar transistor according to Embodiment 1 of the present invention.
Figure 2:
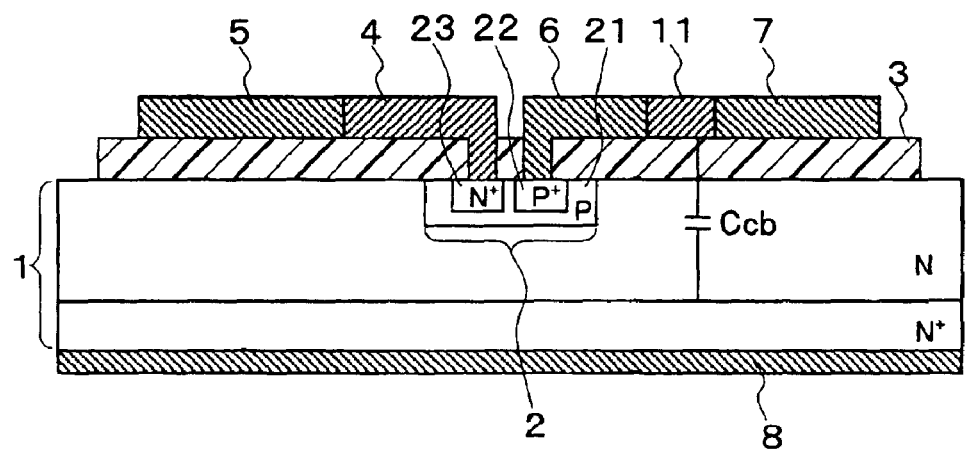
FIG. 2 is a cross-sectional view taken along a line a–a' in FIG. 1.
Figure 9:
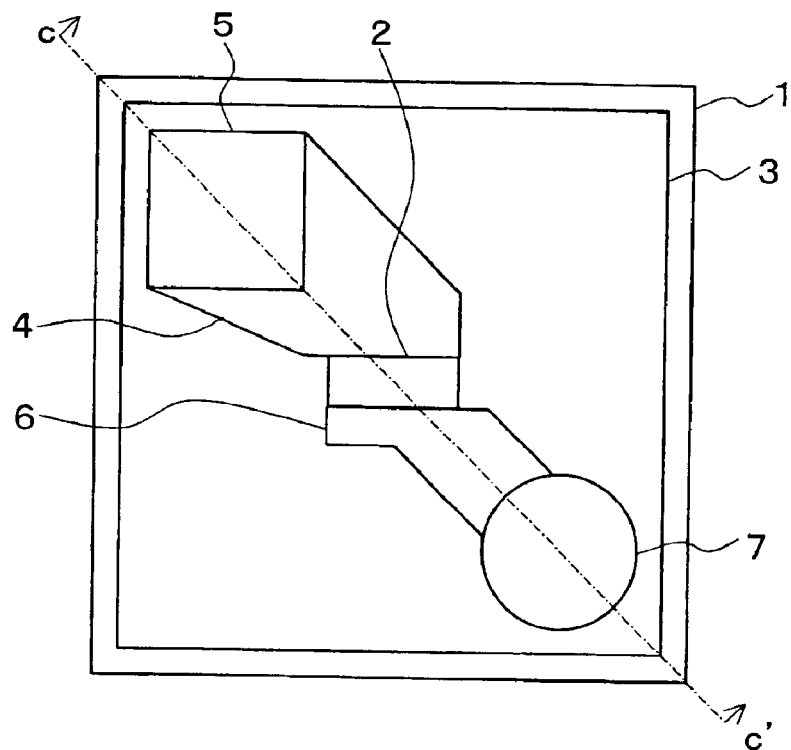
FIG. 9 is a plan view showing an exemplary configuration of a conventional bipolar transistor.
Figure 10:
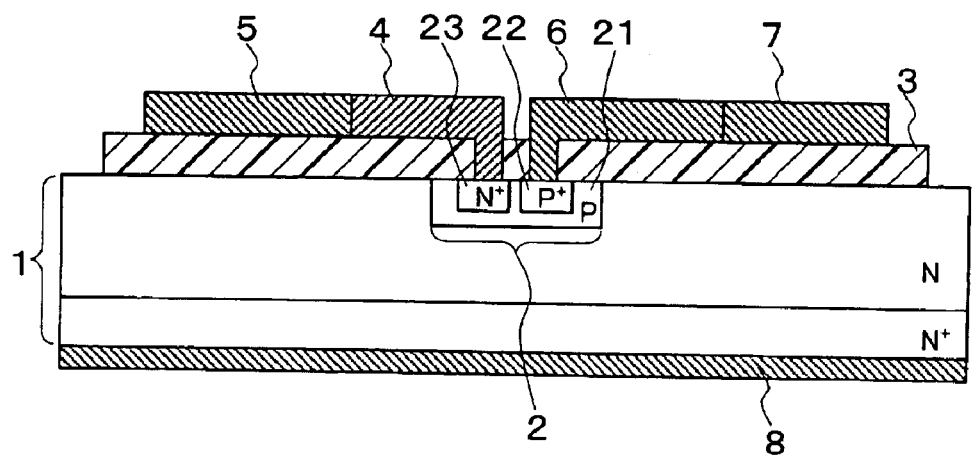
FIG. 10 is a cross-sectional view taken along a line c–c' in FIG. 9.

FIG. 1 is a plan view of a bipolar transistor according to Embodiment 1 of the present invention seen from the upper surface of a chip, and FIG. 2 is a cross-sectional view taken along a line a–a' in FIG. 1. In FIGS. 1 and 2, the same components as those in the conventional example shown in FIGS. 9 and 10 are denoted with the same reference numerals as those therein, and the description thereof will be omitted here.

The present embodiment is different from the conventional example only in that a capacitance adjustment line 11 connected to the base pad 7 is provided.

A part of the capacitance adjustment line 11 is connected to the base pad 7, and the remaining part thereof merely covers an upper portion of the insulating film 3. Therefore, the capacitance adjustment line 11 does not influence the DC (direct current) electric characteristics such as a current amplification ratio and a withstand voltage. On the other hand, regarding an AC (high frequency), the capacitance adjustment line 11 forms a parasitic capacitor with respect to the $N^+$ collector substrate. Therefore, the capacitance value of a collector-base capacitor of the bipolar transistor is increased, and the collector-base capacitor can be incorporated in a semiconductor chip at least as a part of the balance capacitor $C_{cb}$ of the oscillation circuit 112.

Furthermore, by adjusting the area of the capacitance adjustment line 11, the capacitance value of the collector-base capacitor can be adjusted easily.

Embodiment 2

Figure 3:
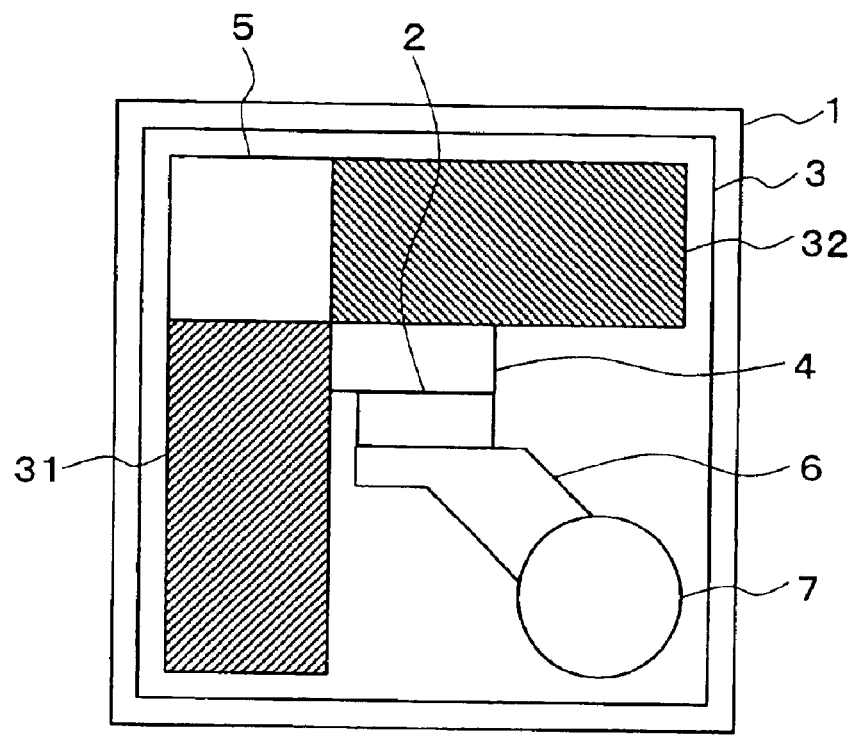
FIG. 3 is a plan view showing an exemplary configuration of a bipolar transistor according to Embodiment 2 of the present invention.

FIG. 3 is a plan view of a bipolar transistor according to Embodiment 2 of the present invention seen from the upper surface of a chip. In FIG. 3, the present embodiment is different from Embodiment 1 in that capacitance adjustment lines 31 and 32 whose one ends are connected to the emitter pad 5 so as to increase collector-emitter capacitance, instead of the collector-base capacitance of the bipolar transistor. The other configuration is the same as that of Embodiment 1, so that the description thereof will be omitted here.

The capacitance adjustment lines 31 and 32 form a parasitic capacitor with respect to the $N^+$ collector substrate. Therefore, the capacitance value of a collector-emitter capacitor of the bipolar transistor is increased, and the collector-emitter capacitor can be incorporated in a semiconductor chip at least as a part of the balance capacitor $C_{ce}$ of the oscillation circuit 112 shown in FIG. 11.

Furthermore, by adjusting the area of the capacitance adjustment lines 31 and 32, the capacitance value of the collector-emitter capacitor can be adjusted easily.

Embodiment 3

Figure 4:
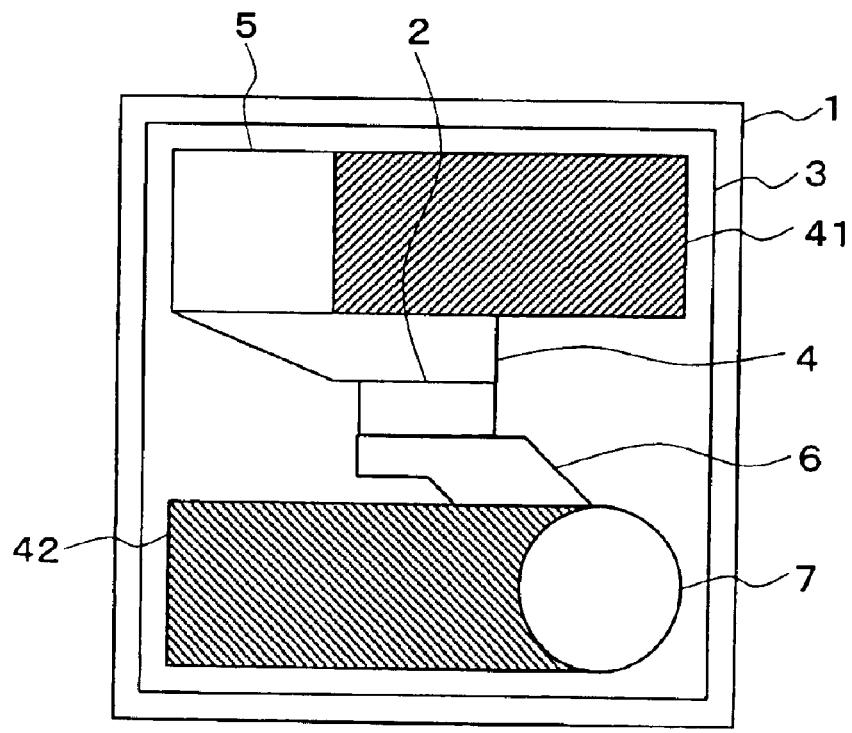
FIG. 4 is a plan view showing an exemplary configuration of a bipolar transistor according to Embodiment 3 of the present invention.

FIG. 4 is a plan view of a bipolar transistor according to Embodiment 3 of the present invention seen from the upper surface of a chip. In FIG. 4, the present embodiment is different from Embodiment 1 in that a capacitance adjustment line 41 whose one end is connected to the emitter pad 5, and a capacitance adjustment line 42 whose one end is connected to the base pad 7 are provided so as to increase both the collector-emitter capacitance and the collector-base capacitance of the bipolar transistor. The other configuration is the same as that of Embodiment 1, so that the description thereof will be omitted here.

The capacitance adjustment lines 41 and 42 form a parasitic capacitor with respect to the $N^+$ collector substrate. Therefore, both the capacitance values of the collector-emitter capacitor and the collector-base capacitor of the bipolar transistor are increased, and the collector-emitter capacitor and the collector-base capacitor can be incorporated in a semiconductor chip at least as a part of the balance capacitors $C_{ce}$ and $C_{cb}$ of the oscillation circuit 112 shown in FIG. 11.

Furthermore, by adjusting the areas of the capacitance adjustment lines 41 and 42, the capacitance value of the collector-emitter capacitor and the capacitance value of the collector-base capacitor can be adjusted easily.

Embodiment 4

Figure 5:
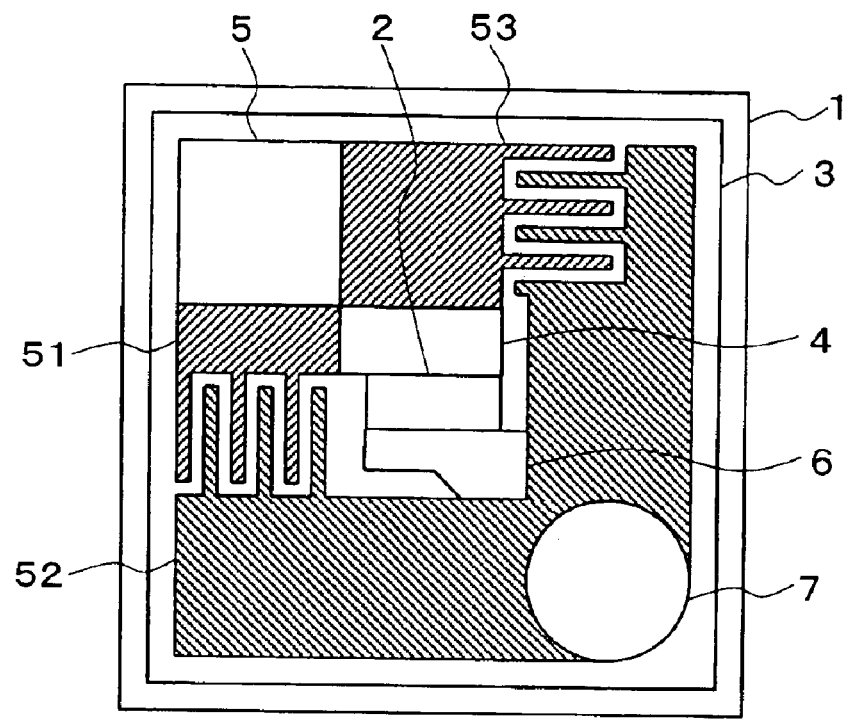
FIG. 5 is a plan view showing an exemplary configuration of a bipolar transistor according to Embodiment 4 of the present invention.

FIG. 5 is a plan view of a bipolar transistor according to Embodiment 4 of the present invention seen from the upper surface of a chip. In FIG. 5, the present embodiment is different from Embodiment 1 in that a capacitance adjustment line 52 partially connected to the base pad 7 is provided so as to increase collector-base capacitance of the bipolar transistor, and capacitance adjustment lines 51 and 53, which are placed in a comb shape with respect to the capacitance adjustment line 52 and whose respective one ends are connected to the emitter pad 5, are provided. The other configuration is the same as that of Embodiment 1, so that the description thereof will be omitted here.

In FIG. 5, the collector-base capacitance is increased in the same way as in Embodiment 1, and in addition, the capacitance adjustment lines 51 and 53 whose one ends are connected to the emitter pad 5 and the capacitance adjustment line 52 partially connected to the base pad 7 are placed in a comb shape, so that the lengths of lines opposed to each other are large. Therefore, the emitter-base capacitor formed as a parasitic capacitor in a comb-shape portion also is increased.

Thus, according to the present embodiment, the collector-base capacitor and the emitter-base capacitor can be incorporated in a semiconductor chip at least as a part of the balance capacitor of the oscillation circuit.

Furthermore, by adjusting the area of the capacitance adjustment line 52, the capacitance value of the collector-base capacitor can be adjusted easily. By adjusting the lengths of lines opposed to each other in the comb-shape portion between the capacitance adjustment lines 51 and 52 and the comb-shape portion between the capacitance adjustment lines 53 and 52, the capacitance value of the emitter-base capacitor can be adjusted easily.

Embodiment 5

Figure 6:
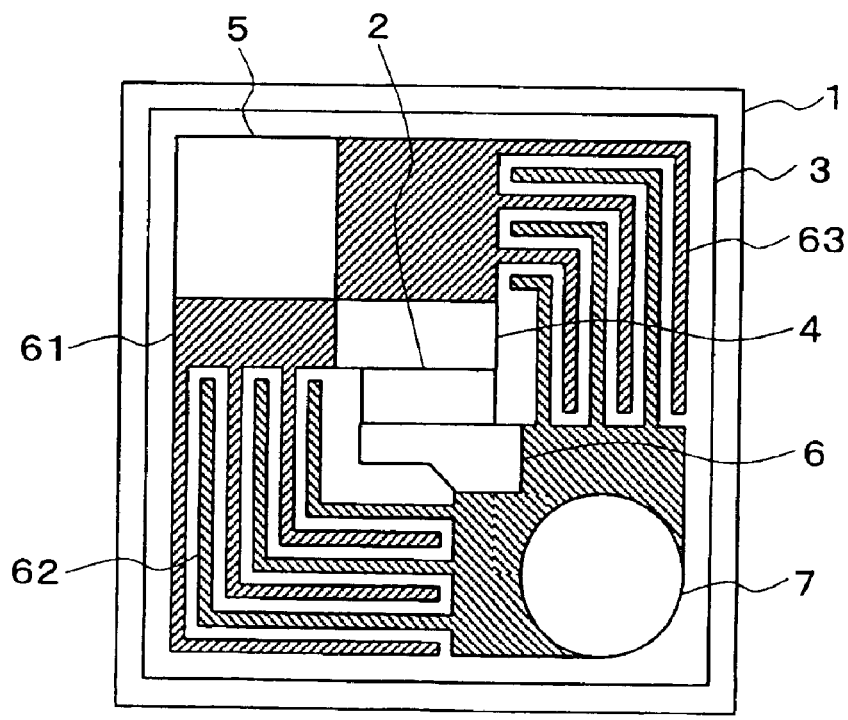
FIG. 6 is a plan view showing an exemplary configuration of a bipolar transistor according to Embodiment 5 of the present invention.

FIG. 6 is a plan view of a bipolar transistor according to Embodiment 5 of the present invention seen from the upper surface of a chip. In FIG. 6, the present embodiment is different from Embodiment 4 in the following points: in Embodiment 4, both the capacitance values of the collector-base capacitor and the emitter-base capacitor are increased, whereas in the present embodiment, in order to increase mainly the emitter-base capacitance, the length of lines opposed to each other in the comb-shape portion between the capacitance adjustment line 62 partially connected to the emitter pad 7 and the capacitance adjustment lines 61 and 63 whose one ends are connected to the emitter pad 5 are made longer than those of Embodiment 4. The other configuration is the same as that of Embodiment 4, so, that the description thereof will be omitted here.

Embodiment 6

Figure 7:
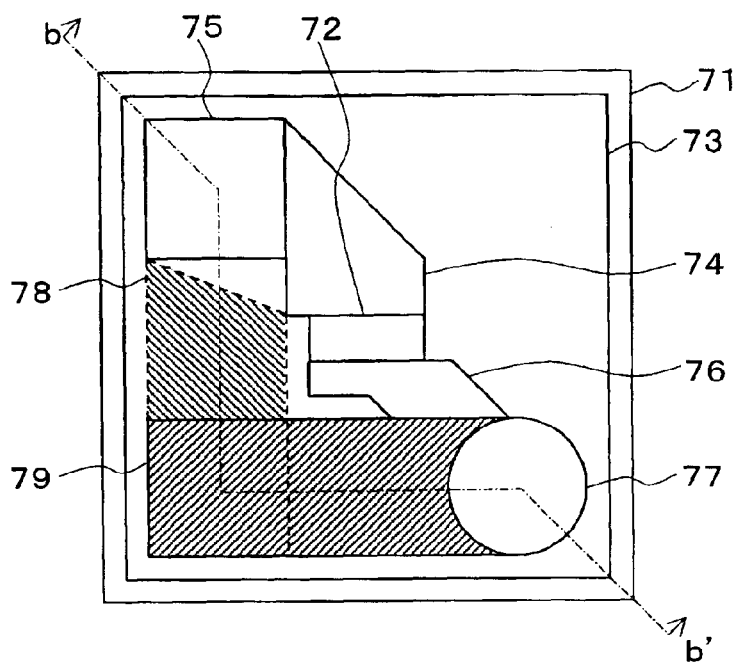
FIG. 7 is a plan view showing an exemplary configuration of a bipolar transistor according to Embodiment 6 of the present invention.
Figure 8:
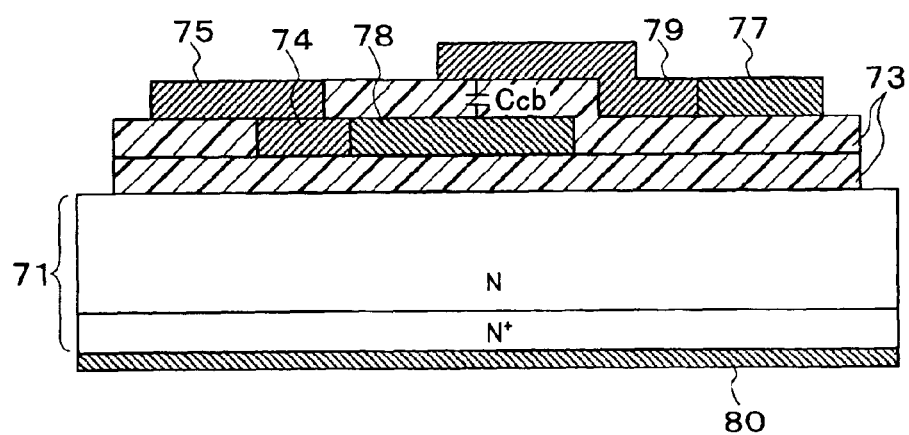
FIG. 8 is a cross-sectional view taken along a line b–b' in FIG. 7.

FIG. 7 is a plan view of a bipolar transistor according to Embodiment 6 of the present invention seen from the upper surface of a chip, and FIG. 8 is a cross-sectional view taken along a line b–b' in FIG. 7. In FIGS. 7 and 8, reference numeral 71 denotes an $N^+/N$ type emitter substrate as a semiconductor substrate; 72 denotes a transistor operation region in which a bipolar transistor is formed; 73 denotes an insulating film formed on the surfaces of the emitter substrate 71 and the transistor operation region 2; 74 and 76 respectively denote a collector lead line and a base lead line formed on the insulating film 73 therethrough from the transistor operation region 72; 75 and 77 respectively denote a collector pad and a base pad connected to the collector lead line 74 and the base lead line 76 and subjected to wire bonding during assembly; and 80 denotes an emitter electrode formed on the reverse surface of the emitter substrate 71. Such a chip configuration will be referred to as a substrate emitter configuration.

Reference numeral 78 denotes a capacitance adjustment line. One end of the capacitance adjustment line 78 is connected to the collector lead line 74, and interposes a part of the insulating film 73 together with a capacitance adjustment line 79 connected to the base pad 77 to form a Metal Insulator Metal (MIM) type capacitor. Because of this configuration, collector-base capacitance is increased, and the collector-base capacitor can be incorporated in a semiconductor chip at least as a part of the balance capacitor $C_{cb}$ of the oscillation circuit 112 shown in FIG. 11. In the present embodiment, unlike Embodiments 1 to 5, a two-layer wiring configuration is required.

In Embodiments 1 to 5, a wiring layer in an uppermost portion is used as the capacitance adjustment line layer. However, in the case where a wiring process of basically at least two layers is used, any wiring layer may be used as a capacitance adjustment line. However, needless to say, it is most effective that a wiring layer in a lowermost portion is used as a capacitance adjustment line.

Furthermore, in Embodiments 1 to 5, the substrate collector configuration has been illustrated and described. However, the present invention is not limited thereto and also is applicable to a substrate emitter configuration. Similarly, in Embodiment 6, the substrate emitter configuration has been illustrated and described. However, the present invention is not limited thereto and also is applicable to a substrate collector configuration.

Furthermore, in Embodiments 1 to 5, as shown in FIG. 2, a horizontal transistor is used, in which the P-type diffusion base 21, the P+ base contact 22, and the N+ emitter 23 are formed in the transistor operation region 2 on the N+/N type collector substrate 1. The present invention is not limited thereto. A vertical transistor with a P-type diffusion base and an N+ emitter may be used.

Figure 13:
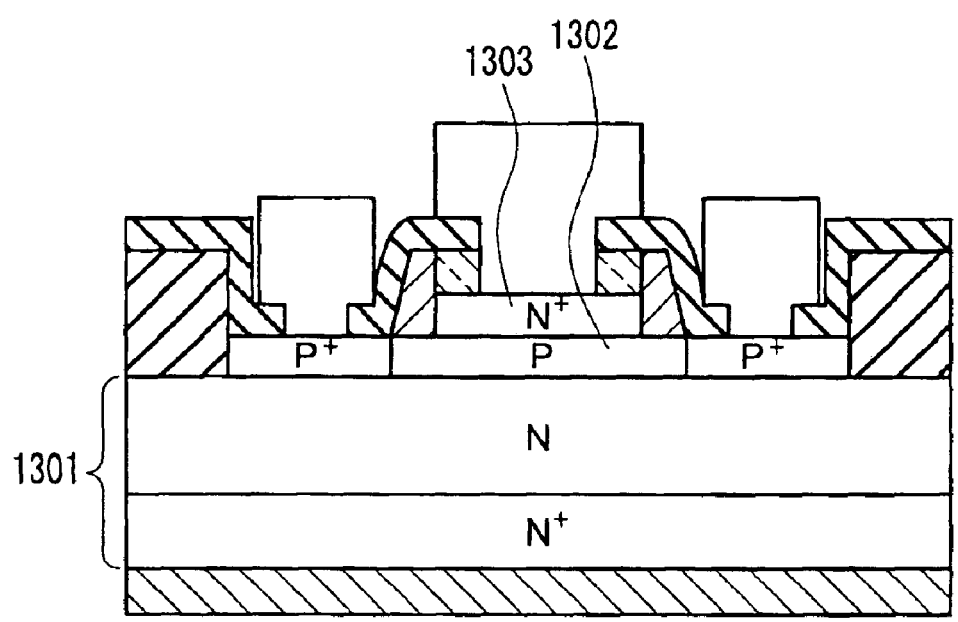
FIG. 13 is a cross-sectional view showing an exemplary configuration of a bipolar transistor according to another embodiment of the present invention.

Furthermore, in Embodiments 1 to 5, as shown in FIG. 2, the P-type diffusion base 21, the P+ base contact 22, and the N+ emitter 23 are formed in a diffusion form. However, the present invention is not limited thereto. As shown in FIG. 13, for example, a P-type diffusion base 1302 and an N+ emitter 1303 formed successively by epitaxial growth on the N+/N type collector substrate 1301 may be used.

The advantage in the case of using the bipolar transistors according to Embodiments 1 to 6 in an oscillation circuit will be described by exemplifying the case of collector-base capacitor with reference to FIG. 12.

Figure 12:
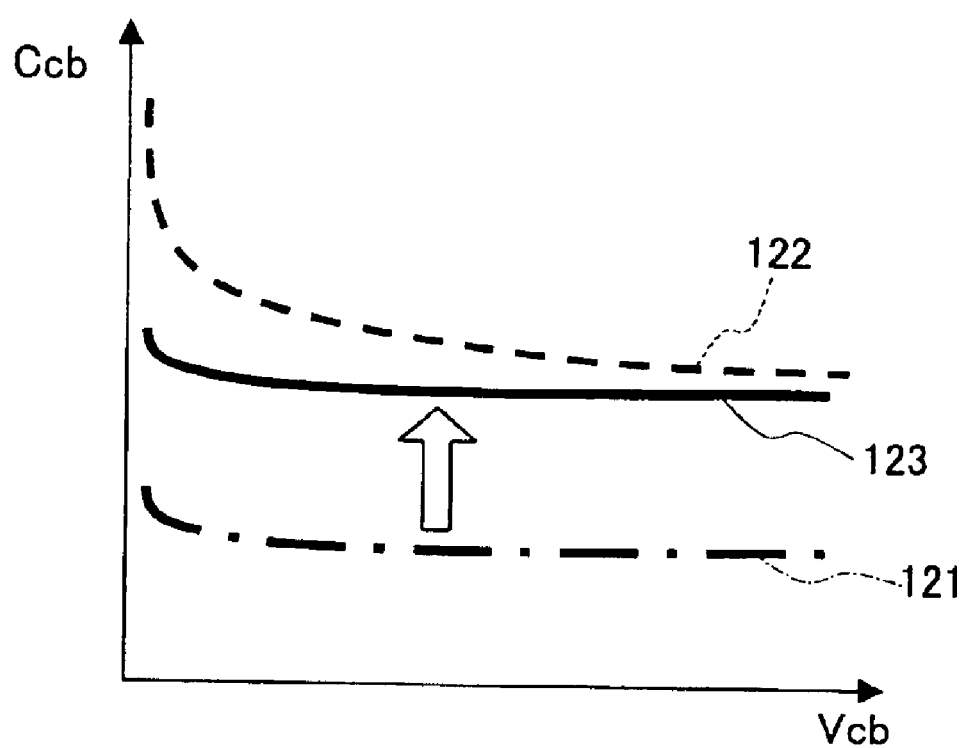
FIG. 12 shows characteristics of a collector-base capacitor for describing the effect of the present invention by comparison.

FIG. 12 shows characteristics of collector-base capacitance ($C_{cb}$) with respect to the collector-base voltage ($V_{cb}$). In FIG. 12, reference numeral 121 denotes capacitance characteristics in the case where a transistor operation region is small, 122 denotes capacitance characteristics in the case where the transistor operation region is large, and 123 denotes capacitance characteristics in the case where the transistor operation region is small and the capacitance adjustment line according to the present invention is used.

Figure 11:
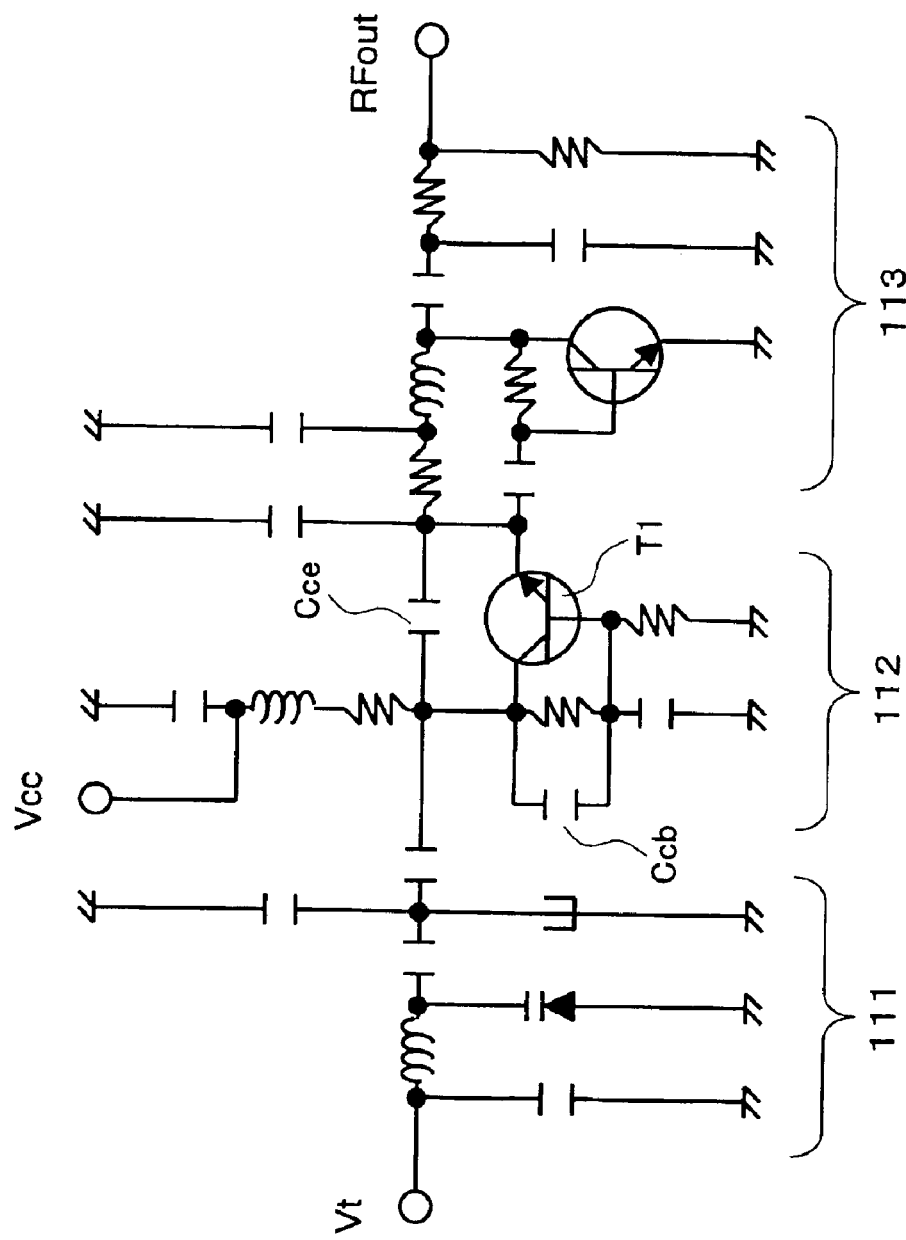
FIG. 11 is a circuit diagram showing a configuration of a general VCO.

In order to enhance the oscillation performance of an oscillation circuit, generally, a bipolar transistor that is an oscillation amplifier is miniaturized to enhance high-frequency characteristics such as a cutoff frequency. However, the miniaturization for the purpose of enhancing high-frequency performance decreases the capacitance in the transistor operation region originally owned by a transistor (capacitance characteristics 121 in FIG. 12). In oscillation at a high frequency close to a cutoff frequency, a small capacitance value of the balance capacitor shown in FIG. 11 is negligible because the feedback amount in the balance capacitor is inversely proportional to the following impedance Z:

$$Z=1/(2\pi fC)$$

where f is an oscillation frequency and C is a capacitance value of the balance capacitor.

When the oscillation frequency f is large, even if the capacitance value C is small, the impedance Z becomes small. Therefore, a sufficient feedback amount can be obtained.

On the other hand, when a high-performance bipolar transistor having small capacitance between terminals is used at a low oscillation frequency, the impedance Z becomes very large, and the feedback amount is insufficient. Therefore, in the conventional example, the capacitance of the externally attached balance capacitor is increased. However, in this case, C/N is degraded due to a decrease in the Q-value of the oscillation circuit as described above. Therefore, in the case where C/N is considered to be important, a bipolar transistor (capacitance characteristics 122 in FIG. 12) having a large transistor operation region is used, in which high-frequency performance is low (i.e., a cutoff frequency is low), sacrificing other various characteristics such as oscillation power and efficiency.

In contrast, according to the configurations of Embodiments 1 to 6, capacitance can be increased apparently as if a large transistor operation region is used, as represented by capacitance characteristics 123 in FIG. 12, without impairing a miniaturized high-performance transistor operation region. Therefore, excellent C/N characteristics and other various characteristics such as an oscillation power and efficiency can be satisfied.

Furthermore, as is apparent from the production process, only the area of a part of a line is increased, so that the number of processes is not increased and the chip area is not enlarged.

As described above, according to the present invention, a balance capacitor of an oscillation circuit is incorporated onto a bipolar transistor that is a discrete device without increasing a production cost as in an IC, higher high-frequency performance, miniaturization, and a reduction in cost can be performed. Furthermore, excellent C/N characteristics and other various characteristics such as an oscillation power and efficiency can be satisfied.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A bipolar transistor comprising:

a semiconductor substrate;

a transistor operation region formed on the semiconductor substrate;

an insulating film formed so as to cover a surface of the semiconductor substrate;

a lead line led to a surface of the insulating film therethrough from the transistor operation region;

a pad for wire bonding connected to the lead line; and a capacitance adjustment line connected to the pad, wherein the semiconductor substrate is an N+/N type collector substrate, a collector electrode is formed on a reverse surface of the collector substrate, and the pad is formed on a surface of the collector substrate as an emitter pad and a base pad.

2. The bipolar transistor according to claim 1, wherein by adjusting lengths of lines opposed to each other of the capacitance adjustment line connected to the emitter pad and the capacitance adjustment line connected to the base pad, a capacitance value of an emitter-base capacitor is adjusted.

3. The bipolar transistor according to claim 2, wherein the capacitance adjustment line connected to the emitter pad and the capacitance adjustment line connected to the base pad are disposed in a comb shape.

4. The bipolar transistor according to claim 1, wherein the semiconductor substrate is an N+/N type emitter substrate, an emitter electrode is formed on a reverse surface of the emitter substrate, and the pad is formed on a surface of the emitter substrate as a collector pad and a base pad.

5. The bipolar transistor according to claim 4, wherein the capacitance adjustment line connected to the collector pad and the capacitance adjustment line connected to the base pad, which is opposed to the capacitance adjustment line connected to the collector pad, interpose the insulating film therebetween to form a collector-base capacitor as a Metal-Insulator-Metal (MIM) type capacitor, and by adjusting an opposed area of the capacitance adjustment lines, a capacitance value of the collector-base capacitor is adjusted.

6. A bipolar transistor comprising:

a semiconductor substrate;

a transistor operation region formed on the semiconductor substrate:

an insulating film formed so as to cover a surface of the semiconductor substrate;

a lead line led to a surface of the insulating film therethrough from the transistor operation region;

a pad for wire bonding connected to the lead line; and a capacitance adjustment line connected to the pad, wherein the semiconductor substrate is an N+/N type collector substrate, a collector electrode is formed on a reverse surface of the collector substrate, and the pad is formed on a surface of the collector substrate as an emitter pad and a base pad, wherein by adjusting an area of the capacitance adjustment line connected to at least one of the base pad and the emitter pad, at least one capacitance value of a corresponding collector-base capacitor and collector-emitter capacitor is adjusted.

* * * * *